United States Patent [19]
Knecht et al.

[11] Patent Number: 5,353,621
[45] Date of Patent: Oct. 11, 1994

[54] PIEZOELECTRIC COMPONENT MOUNTING FOIL AND FOIL-MAKING METHOD

[75] Inventors: Thomas A. Knecht, Crystal Lake; Jean-Robert Achille, Bloomingdale, both of Ill.

[73] Assignee: Motorola, Inc., Schaumburg, Ill.

[21] Appl. No.: 84,751

[22] Filed: Jun. 29, 1993

Related U.S. Application Data

[63] Continuation of Ser. No. 582,067, Sep. 14, 1990, abandoned.

[51] Int. Cl.$^5$ .............................................. B21C 37/02
[52] U.S. Cl. ............................... 72/379.2; 29/25.35; 29/854; 29/855; 29/856; 29/874; 310/340; 310/348; 310/351; 310/354; 310/355; 428/99; 428/598; 428/603
[58] Field of Search ............... 428/99, 598, 603; 310/348, 351, 354, 355, 340; 29/25.35, 854, 855, 856, 874; 72/379.2

[56] References Cited

U.S. PATENT DOCUMENTS

| | | | |
|---|---|---|---|
| 2,128,420 | 8/1938 | Laskey | 310/351 |
| 2,954,490 | 9/1960 | Warner | 310/353 |
| 4,266,157 | 5/1981 | Peters | 310/353 |
| 4,642,510 | 2/1987 | Yamashita | 310/351 |
| 4,827,611 | 5/1989 | Pai | 29/854 |
| 4,859,898 | 8/1989 | Aubry | 310/348 |

FOREIGN PATENT DOCUMENTS

| | | | |
|---|---|---|---|
| 1157673 | 11/1963 | Fed. Rep. of Germany | 310/353 |
| 2755116 | 6/1979 | Fed. Rep. of Germany | 310/353 |

*Primary Examiner*—Ellis P. Robinson
*Assistant Examiner*—Nasser Ahmad
*Attorney, Agent, or Firm*—Darleen J. Stockley

[57] ABSTRACT

A piezoelectric component-mounting foil and foil making method are disclosed, whereby a first portion of the foil in a first plane substantially parallel to a second portion of the foil in a second plane are connected by a central portion not in the first or second plane, the central portion having at least one width dimension of the central portion less than at least one length dimension of the central portion. A conductive foil material, appropriate thickness, overall geometry, and, if desired, appropriate notch configuration are selected for a desired implementation of the foil for conductively attaching and at least partially supporting at least one piezoelectric component such as a quartz crystal.

7 Claims, 2 Drawing Sheets

PIEZOELECTRIC COMPONENT MOUNTING FOIL AND FOIL-MAKING METHOD

This is a continuation of application Ser. No. 07/582,067, filed Sep. 14, 1990 and now abandoned.

FIELD OF THE INVENTION

This invention relates in general to electrical component mounting devices, and more particularly to piezoelectric component mounting devices.

BACKGROUND OF THE INVENTION

Piezoelectric components generally are stimulated to resonate close to a desired resonance frequency. However, thermal expansion coefficients of piezoelectric components typically differ substantially from thermal expansion coefficients of substrates on which they are mounted. Thus, springs are generally utilized to mount piezoelectric components to substrates to aid in minimizing stress on piezoelectric components due to thermal expansion.

Springs, however, typically are deformed due to thermal expansion as well as acceleration, causing deformation of a piezoelectric component and subsequent variation from a desired frequency. Springs also have generally been unable to demonstrate a high degree of adjustability for mounting different piezoelectric components.

Thus, there is a need for a mounting device that does not cause significant deformity of a piezoelectric device due to thermal expansion and acceleration, and simultaneously provides adaptability for mounting a selected piezoelectrical component.

SUMMARY OF THE INVENTION

The present invention comprises at least one foil for mounting at least one piezoelectric component, wherein the at least one foil comprises: a first portion of the foil in a first plane, having at least a thickness dimension, the first portion being suitable for attaching to a conducting medium and having a first area comprising a first linking area; a central portion of the foil, being in at least in a second plane substantially not parallel to the first plane of the first portion, the central portion having at least a first side, at least one thickness dimension, at least one length dimension, at least one width dimension, and at least a second area comprising a second linking area, wherein the first side is substantially opposite the second linking area and is substantially linked to the first linking area, such that at least a part of the central portion has at least one width dimension less than at least one length dimension of the central portion; and a second portion of the foil having at least a thickness dimension and at least a third linking area, the second portion being linked to the second linking area of the central portion of the foil at the third linking area, such that the second portion of the foil is in a third plane substantially parallel to the first plane of the first portion of the foil and has at least a thickness dimension, the second portion being substantially suitable for conductively attaching and at least partially supporting at least one piezoelectric component. The thickness dimensions of the first portion, the central portion, and the second portion are each at least less than at least one length dimension of the central portion.

DETAILED DESCRIPTION OF A PREFERRED EMBODIMENT

Figure 1A:
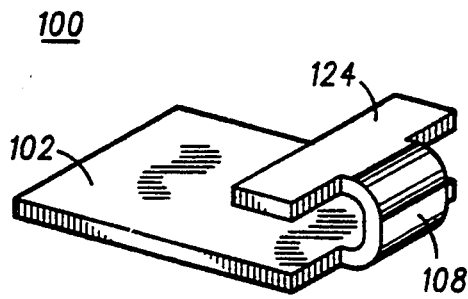
FIG. 1A sets forth a perspective view of one embodiment of the present invention.
Figure 1B:
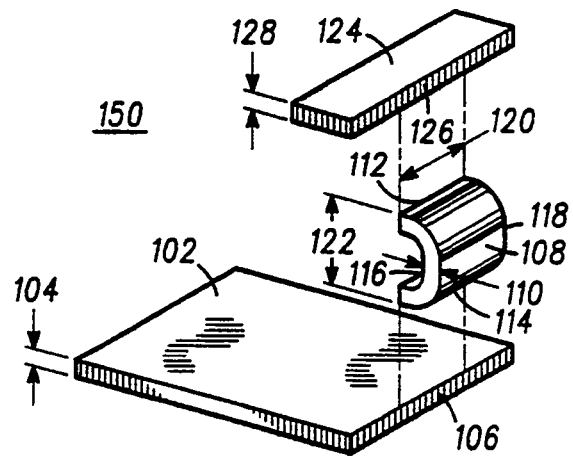
FIG. 1B sets forth a further representation of the embodiment represented in FIG. 1A wherein three portions of a foil are separated to aid in illustrating linkage.

FIG. 1A, numeral 100, illustrates a perspective view of one embodiment of the present invention. FIG. 1B illustrates FIG. 1A further by separating three portions of a foil to aid in illustrating linkage. A first portion (102) of a foil in a first plane, the first portion (102) having at least a thickness dimension (104) and a first area comprising a first linking area (106), is suitable for conductively attaching to a conductive medium. Attachment may, for example, be accomplished by utilizing silver epoxy. Typically the foil consists substantially of a springlike conductive material, typically having a low hysteresis. Metallic substances such as Ni(Ag), for example, in combinations known as 770 and 752, are typical foil materials. Other materials that may be utilized for making a suitable foil are, among others: nickel, KOVAR, alloy 42, alloy 52, stainless steel, BeCu, phosphor bronze, and PtW. Typically a first portion (102) is connected to a conductive substance located on a substrate.

The first portion (102) is connected to a first side (114) of a central portion (108) of the foil at the first linking area (106), the central portion being at least in a second plane not substantially parallel to the first plane of the first portion (102). The central portion (108) has at least a first side (112), at least one thickness dimension (110), at least one length dimension (122), at least one width dimension (120) such that at least a part of the central portion (108) has a width dimension (120) less than a length dimension (122) of the central portion (108), and at least a second area comprising a second linking area (112). The first side (114) is substantially opposite the second linking area (112), and is substantially linked to the first linking area (106), substantially forming a "C" configuration.

A second portion (124) of the foil has at least a thickness dimension (128) and a third linking area (126) that is linked to the central portion (108) of the foil at the second linking area (112), such that the second portion (124) of the foil is in a third plane substantially parallel to the first plane of the first portion (102) of the foil. The second portion (124) is substantially suitable for conductively attaching and at least partially supporting at least one piezoelectric component. For example, silver epoxy may be utilized for attachment and electrical connection for the piezoelectric component.

Figure 2:
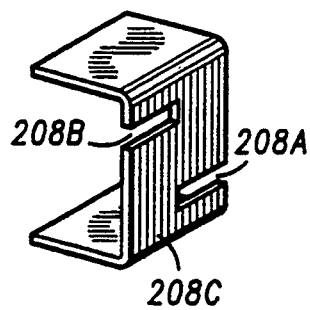
FIGS. 2, 3, 4, 5, 6, and 7 represent a series of perspective views of alternative embodiments of the present invention.
Figure 3:
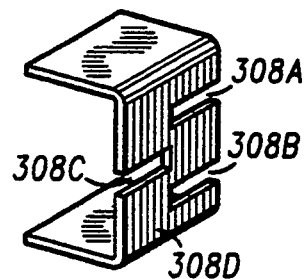
Figure 4:
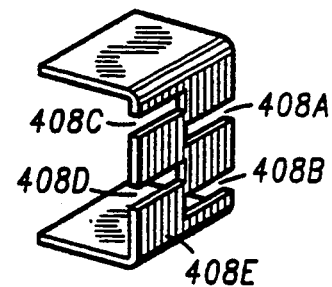
Figure 5:
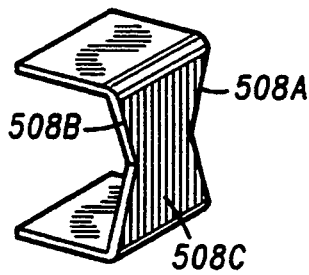
Figure 7:
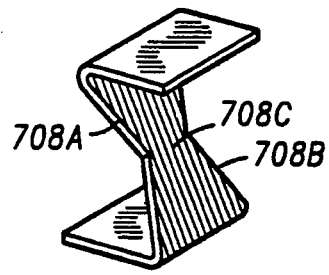
Figure 8:
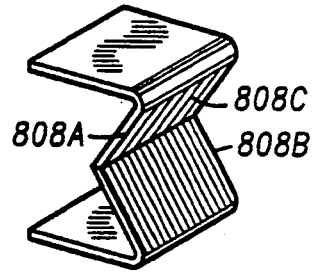
FIG. 8 illustrates a foil of the present invention with a triangular notch on each of two sides of the central portion, the central portion being bent to obtain two new portions in a fourth and a fifth plane, such that the fourth and fifth planes are not in a same plane.
Figure 6:
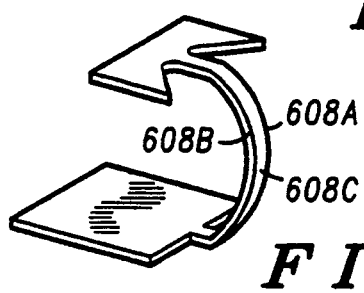

FIGS. 2, 3, 4, 5, 6, and 7 represent a series of perspective views of alternative embodiments of the present invention. A notch is defined as an opening formed along at least one side joining the first portion and the second portion of the central portion such that at least one width dimension of the central portion obtained thereby is less than at least one of: the width dimension of the central portion along the first linking area and the width dimension of the central portion along the second linking area. As set forth in FIGS. 2–8, the central portion (208c, 308d, 408e, 508c, 608c, 708c, 808c) may, if desired, have at least one notch (208a, 208b, 308a, 308b, 308c, 408a, 408b, 408c, 408d, 508a, 508b, 608a, 608b, 708a, 708b, 808a, 808b) along any of the sides of the central portion that are not linked by a linking area as set forth above to the first portion of the foil or the second portion of the foil. FIGS. 2, 3, and 4 illustrate utilization of various numbers of substantially rectangular notches (208a, 208b, 308a, 308b, 308c, 408a, 408b, 408c, 408d) in the central portion (208c, 308d, 408e). Selected alternative shaped notches (508a, 508b, 608a, 608b) are illustrated in the central portion (508c, 608c). It is clear that any desired number and any desired shape of notches may be utilized. Further, as illustrated by FIG. 7, the central portion (708c) may be implemented in at least one plane at any selected angle with the substantially parallel planes of the first portion (102) and the second portion (124). In addition, the central portion may be implemented such that at least two planes are occupied. For example, FIG. 8 illustrates a foil with a triangular notch on each of two sides of the central portion (808c) and the central portion (808c) bent to obtain two new portions in a fourth and a fifth plane, such that the fourth and fifth planes are not in a same plane.

Figure 9:
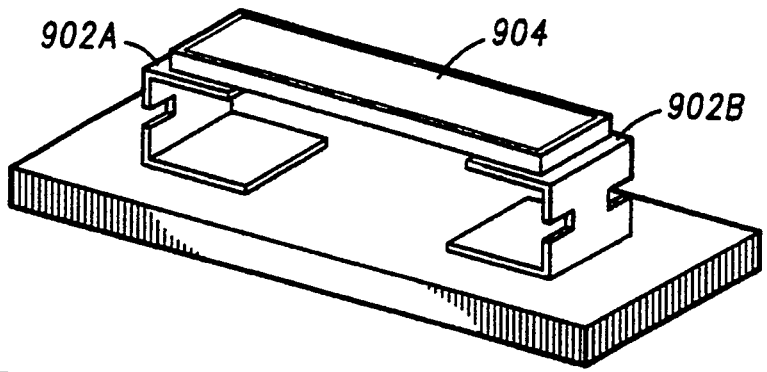
FIG. 9 illustrates an implementation of at least two foils of the present invention utilized to support and conductively attach a piezoelectric component to a base.

In one implementation, set forth in FIG. 9, at least two foils (902a, 902b) of the present invention, situated substantially opposite one another, may be utilized to support and conductively attach a piezoelectric component (904) to a base for further mounting in a desired system, and alternatively, to a conductively plated substrate.

Utilizing the foil of the present invention provides improved temperature compensation characteristics, good thermal shock resistance, good mechanical shock and vibration resistance, low thermal hysteresis, and good long-term stability. These advantages may be obtained by selecting an appropriate conductive material for the foil, an appropriate foil thickness, an over-all geometry suitable for a given usage, and by varying a notch configuration until reaching a desired result.

Figure 10:
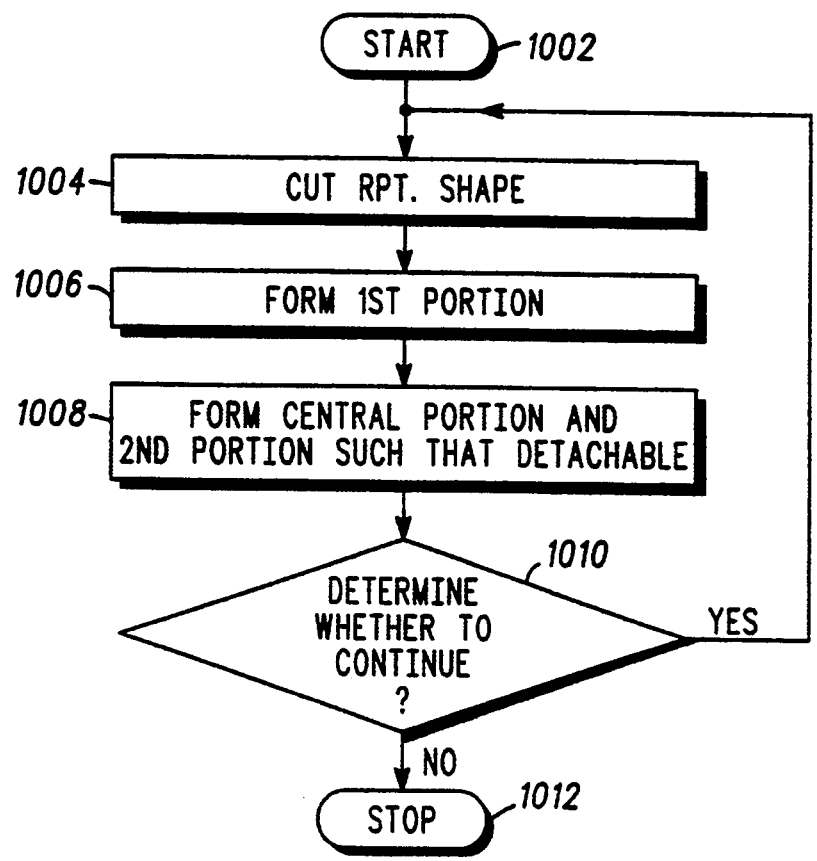
FIG. 10 represents a flowchart illustrating the steps of the method of the present invention.

A method of the present invention is set forth in FIG. 10. The method comprises at least the steps of: upon starting (1002), cutting at least a portion (PRT.) of the foil shape from a source of conductive foil material (1004); bending the foil shape such that a first portion of the foil is substantially formed in a first plane, having the first portion suitable for conductively attaching to a conducting medium and having a first area comprising a first linking area (1006); bending the foil such that a central portion of the foil is formed, the central portion being at least in a second plane substantially not parallel to the first plane of the first portion, the central portion having at least a thickness dimension, at least one length dimension, at least one width dimension, and at least a second area comprising a second linking area, wherein the first side is substantially opposite the second linking area and is substantially linked to the first linking area, such that at least a part of the central portion has at least one width dimension less than at least one length dimension of the central portion and such that a second portion of the foil is substantially linked to the central portion of the foil at the second linking area, and such that the second portion of the foil is in a third plane substantially parallel to the first plane of the first portion of the foil, the second portion being substantially suitable for conductively attaching and at least partially supporting at least one piezoelectric component (1008) such that the at least one foil is detachably attached to the foil source in a manner facilitating detachment from the foil source and subsequent conductive mount attachment; determining whether to continue the above-recited steps; when desiring to continue (1010), recycling to the step of cutting at least a portion (PRT.) of a desired foil shape from a source of conductive foil material (1004); and when desiring not to continue (1010), stopping (1012). It is clear that the second portion of the foil may be formed first, as desired. A conductive foil material that is substantially resilient, and typically metallic, more particularly described above, is utilized. To facilitate automation of foil-making, the source may be a reel of conductive foil material. Cutting at least a portion of the foil shape is typically selected to partially sever the foil shape from the source of conductive foil material, thereby yielding at least one foil detachably attached to the foil source. The piezoelectric component is generally quartz. Also, the central portion may vary in shape as described above.

We claim:

1. A method for making at least one substantially "C" shaped piezoelectric component mounting metallic foil the at least one metallic foil having a shape, comprising at least the steps of:

A) cutting at least a portion of the metallic foil shape from a source of conductive metallic foil material;

B) bending the metallic foil shape such that a first portion of the metallic foil is formed in a first plane, having the first portion suitable for conductively attaching to a conducting medium and having a first area comprising a first linking area;

C) bending the metallic foil such that a central portion of the metallic foil is formed, the central portion being at least in a second plane not parallel to the first plane of the first portion, the central portion having at least a first side, at least one thickness dimension, at least one length dimension, at least one width dimension, and at least a second area comprising a second linking area, wherein the first side is opposite the second linking area and is linked to the first linking are, such that at least a part of the central portion has at least one width dimension less than at least one length dimension of the central portion; and such that a second portion of the metallic foil is linked to the central portion of the metallic foil at the second linking area, and such that the second portion of the metallic foil is in a third plane parallel to the first plane of the first portion of the metallic foil, the second portion being suitable for conductively attaching and at least partially supporting at least one piezoelectric component;

such that the at least one metallic foil is detachably attached to the metallic foil source in a manner facilitating detachment from the metallic foil source and subsequent conductive mount attachment.

2. A method for making at least one piezoelectric component mounting metallic foil, the at least one metallic foil having a shape, comprising at least the steps of:

A) cutting at least a portion of the metallic foil shape from a source of conductive metallic foil material;

B) bending the metallic foil shape such that a first portion of the metallic foil is formed in a first plane, having the first portion suitable for conductively attaching to a conducting medium and having a first area comprising a first linking area;

C) bending the metallic foil such that a central portion of the metallic foil is formed, the central portion being at least in a second plane not parallel to the first plane of the first portion, the central portion having at least a first side, at least one thickness dimension, at least one length dimension, at least one width dimension, and at least a second area comprising a second linking area, wherein the first side is opposite the second linking area and is linked to the first linking area, such that at least a part of the central portion has at least one width dimension less than at least one length dimension of the central portion; and such that a second portion of the metallic foil is linked to the central portion of the metallic foil at the second linking area, and such that the second portion of the metallic foil is in a third plane parallel to the first plane of the first portion of the metallic foil, the second portion being suitable for conductively attaching and at least partially supporting at least one piezoelectric component;

such that the metallic, foil has substantially a "C" configuration and such that the at least one metallic, foil is detachably attached to the metallic foil source in a manner facilitating detachment from the metallic foil source and subsequent conductive mount attachment.

3. A method for making at least one substantially "C" shaped piezoelectric component mounting metallic foil, the at least one foil having a shape, comprising at least the steps of:

A) cutting at least a portion of the foil shape from a source of conductive foil material;

B) bending the foil shape such that a first portion of the foil is formed in a first plane, having the first portion suitable for conductively attaching to a conducting medium and having a first area comprising a first linking area;

C) bending the foil such that a central portion of the foil is formed, the central portion being a least in a second plane not parallel to the first plane of the first portion, the central portion having at least a first side, at least one thickness dimension, at least one length dimension, at least one width dimension, and at least a second area comprising a second linking area, wherein the first side is opposite the second linking area and is linked to the first linking area, such that at least a part of the central portion has at least one width dimension less than at least one length dimension of the central portion; and such that a second portion of the foil is linked to the central portion of the foil at the second linking area, and such that the second portion of the foil is in a third plane parallel to the first plane of the first portion of the foil, the second portion being suitable for conductively attaching and at least partially supporting at least one piezoelectric component;

such that the at least one foil is detachably attached to the foil source in a manner facilitating detachment from the foil source and subsequent conductive mount attachment, wherein the conductive foil material is resilient.

4. The method of claim 1 wherein the source of conductive metallic foil material is a reel of the conductive metallic foil material.

5. The at least one metallic foil of claim 1, wherein the piezoelectric component is quartz.

6. The at least one metallic foil of claim 1, wherein the central portion occupies at least two planes.

7. The at least one metallic foil of claim 1, wherein the central portion has at least one notch along any of the sides not linked to the first portion of the metallic foil and the second portion of the metallic foil.

* * * * *

UNITED STATES PATENT AND TRADEMARK OFFICE
CERTIFICATE OF CORRECTION

PATENT NO. : 5,353,621
DATED : October 11, 1994
INVENTOR(S) : Thomas A. Knecht and Jean-Robert Achille It is certified that error appears in the above-identified patent and that said Letters Patent is hereby corrected as shown below:

In the claims:

At column 5, line 37, "metallic, foil" should be --metallic foil--.
At column 5, line 39, "metallic, foil" should be --metallic foil--.

Signed and Sealed this

Twentieth Day of December, 1994

*Attest:*

BRUCE LEHMAN

*Attesting Officer*     Commissioner of Patents and Trademarks